(12) United States Patent
Park et al.

(10) Patent No.: US 10,636,846 B2
(45) Date of Patent: Apr. 28, 2020

(54) DISPLAY DEVICE INCLUDING DUMMY SEMICONDUCTOR PATTERN

(71) Applicant: Samsung Display Co., Ltd., Yongin-si, Gyeonggi-do (KR)

(72) Inventors: Kyong Tae Park, Suwon-si (KR); Jung Tae Kim, Seoul (KR); Sung Ho Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 29 days.

(21) Appl. No.: 15/927,233

(22) Filed: Mar. 21, 2018

(65) Prior Publication Data

US 2019/0123114 A1 Apr. 25, 2019

(30) Foreign Application Priority Data

Oct. 20, 2017 (KR) .................. 10-2017-0136468

(51) Int. Cl.
*H01L 27/32* (2006.01)
*H01L 51/00* (2006.01)

(52) U.S. Cl.
CPC ...... *H01L 27/3223* (2013.01); *H01L 27/3276* (2013.01); *H01L 27/323* (2013.01); *H01L 27/3262* (2013.01); *H01L 27/3265* (2013.01); *H01L 51/0097* (2013.01); *H01L 2251/5338* (2013.01)

(58) Field of Classification Search
CPC . H01L 27/3223; H01L 27/3276; G02F 1/133; G02F 1/13306
See application file for complete search history.

(56) References Cited

U.S. PATENT DOCUMENTS

| | | | |
|---|---|---|---|
| 10,170,534 B1 * | 1/2019 | Kim .................... | H01L 27/3246 |
| 2003/0122495 A1 * | 7/2003 | Nakanishi .......... | G02F 1/13454 |
| | | | 315/169.3 |
| 2003/0137242 A1 * | 7/2003 | Seki .................... | H01L 27/3246 |
| | | | 313/506 |

(Continued)

FOREIGN PATENT DOCUMENTS

| KR | 100862851 B1 | 10/2008 |
|---|---|---|
| KR | 1020120040916 A | 4/2012 |
| KR | 1020170054715 A | 5/2017 |

*Primary Examiner* — Allen L Parker
*Assistant Examiner* — Gustavo G Ramallo
(74) *Attorney, Agent, or Firm* — Cantor Colburn LLP

(57) ABSTRACT

A display device includes a display panel that includes a display area and a non-display area which is adjacent to the display area. The display panel includes: a plurality of data lines in the display area; a data connection line provided in plurality through which data signals are transmitted to the display area from outside the display panel, the data connection lines electrically connected to the data lines in the display area; dummy semiconductor patterns respectively disposed between the substrate and the data connection lines; and a first insulating layer disposed between the dummy semiconductor patterns and the data connection lines. Each of the dummy semiconductor patterns include semiconductor pattern segments arranged between the substrate and a same data connection line among the data connection lines, and the semiconductor pattern segments are arranged separated from each other along the same data connection line in a top plan view.

19 Claims, 8 Drawing Sheets

(56) References Cited

U.S. PATENT DOCUMENTS

2008/0283836 A1* 11/2008 Lee .................... H01L 27/3248
  257/59
2018/0040672 A1* 2/2018 Park ...................... G06F 3/0412

* cited by examiner

DISPLAY DEVICE INCLUDING DUMMY SEMICONDUCTOR PATTERN

This application claims priority to Korean Patent Application No. 10-2017-0136468 filed on Oct. 20, 2017, and all the benefits accruing therefrom under 35 U.S.C. § 119, the entire contents of which are incorporated herein by reference.

BACKGROUND (a) Field

This disclosure relates to a display device.

(b) Description of the Related Art

A display device such as an organic light emitting diode display and a liquid crystal display is commonly used. The display device includes a display panel including pixels with which an image is displayed. Pixels are positioned in a display area of the display panel corresponding to a screen of the display device, and signal transfer lines for transferring signals that are applied to the display area are positioned in a non-display area which is adjacent to the display area of the display panel.

Transistors including semiconductor layers are disposed in the display area.

SUMMARY

Exemplary embodiments provide a display device capable of having improved display quality.

An exemplary embodiment provides a display device including a display panel that includes a display area and a non-display area which is adjacent to the display area. The display panel includes: a substrate; a plurality of data lines disposed on the substrate, in the display area; a plurality of data connection line provided in plurality through which data signals are transmitted to the display area from outside the display panel, the data connection lines electrically connected to the data lines; dummy semiconductor patterns respectively disposed between the substrate and the data connection lines; and a first insulating layer disposed between the dummy semiconductor patterns and the data connection lines. Each of the dummy semiconductor patterns include a plurality of semiconductor pattern segments arranged between the substrate and a same data connection line among the data connection lines, and the semiconductor pattern segments are arranged separated from each other along the same data connection line in a top plan view.

For a same data connection line, the semiconductor pattern segments may be separated from each other in a first direction in which lengths of the data lines extend, and for adjacent data connection lines, the semiconductor pattern segments may be separated from each other in a second direction that crosses the first direction.

Among the data connection lines, within each data connection line, in the top plan view, a first portion thereof overlaps the semiconductor pattern segments and a second portion thereof is disposed between semiconductor pattern segments separated from each other along the first direction, and along the second direction, the second portions may alternate with the semiconductor pattern segments.

Lengths of the data connectors may extend in an inclined direction with respect to the first direction.

The data connection lines may include a plurality of first data connection lines and a plurality of second data connection lines which are alternated in a second direction that crosses a first direction in which lengths of the data lines extend, and the display panel may further include a second insulating layer disposed between the first data connection lines and the second data connection lines, and a third insulating layer which disposes the second data connection lines between the third insulating layer and second insulating layer.

The display panel may include a transistor with which a data signal among the data signals is provided to the display area, a storage capacitor positioned in the display area, a semiconductor layer of the transistor may be positioned between the substrate and the first insulating layer, a first electrode of the transistor and a first electrode of the storage capacitor may be positioned between the first insulating layer and the second insulating layer, and a second electrode of the storage capacitor may be positioned between the second insulating layer and the third insulating layer.

The semiconductor pattern segments may include a plurality of first semiconductor segments that overlap the first data connection lines and a plurality of second semiconductor segments that overlap the second data connection lines, and the second semiconductor segments may be doped at a different level than that of the first semiconductor segments.

Among the first and second data connection lines which alternate with each other in the second direction, within each first data connection line, in the top plan view, a first portion thereof overlaps the first semiconductor segments and a second portion is disposed between the first semiconductor segments, and along the second direction, the second portions of the first data collection lines may be respectively directly adjacent to a second semiconductor segment. Among the first and second data connection lines which alternate with each other in the second direction, within each second data connection line, in the top plan view, a first portion thereof overlaps the second semiconductor segments and a second portion thereof is disposed between the second semiconductor segments, and along the second direction, the second portions of the second data collection lines may be respectively directly adjacent to a first semiconductor segment.

The display panel may further include a bending region positioned in the non-display area. The data connection lines in the non-display area may extend across the bending region to the display area, a portion of each of the data connection lines which is between the bending region and the display area defining a data connector. For the data connectors of the data connection lines, the plurality of semiconductor pattern segments may be disposed between the substrate and a same data connector, the semiconductor pattern segments being arranged separated from each other along the same data connector in the top plan view.

The display panel may further include a pad portion positioned in the non-display area and through which the data signals are provided to the display panel from outside thereof, and an integrated circuit chip disposed between the pad portion and the bending region and through which the data signals are provided from the pad portion to the data connection lines in the non-display area. The display device may further include a flexible substrate printed circuit film bonded to the pad portion and from which the data signals are provided to the pad portion of the display panel.

The data connectors as respective portions of the plurality of data connection lines which are between the bending region and the display area transfer the may transfer the data signals from the integrated circuit chip to the data lines.

The display device may further include a flexible substrate printed circuit film bonded to the pad portion and an integrated circuit chip mounted in the flexible substrate printed circuit film, and the data connectors as respective portions of the plurality of data connection lines which are between the bending region and the display area may transfer the data signals from the flexible printed circuit film to the data lines.

The data connection lines in the non-display area may extend therefrom to the display area, a portion of each of the data connection lines which is closest to the display area may define a data connector. Tor the data connectors of the data connection lines: the plurality of semiconductor pattern segments may be arranged between the substrate and a same data connector, and a width of the semiconductor pattern segments may be smaller than, equal to or larger than that of the data connectors.

According to one of more of the exemplary embodiments, display quality deterioration which may occur due to a density difference with the semiconductor pattern of the display area may be reduced or effectively prevented, by forming segmented dummy semiconductor patterns in the non-display area that is adjacent to the display area.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
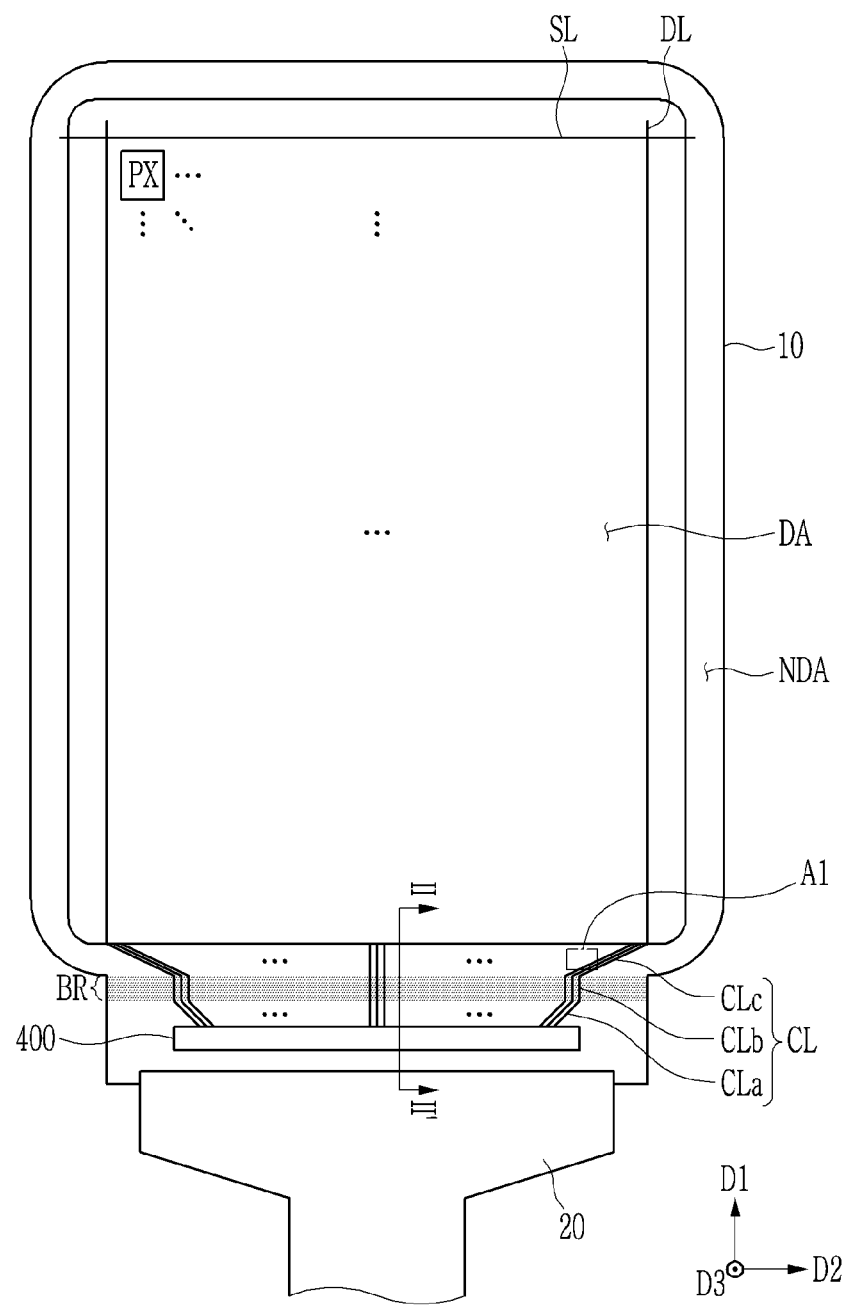
FIG. 1 is a top plan view schematically illustrating an exemplary embodiment of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

Like reference numerals designate like elements throughout the specification. In the drawings, the thickness or sizes of respective layers and areas may be enlarged or reduced to clearly illustrate their arrangements and relative positions.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Further, in the specification, the phrase "in a plan view" means when an object portion is viewed from above, and the phrase "in a cross-section" means when a cross-section taken by vertically cutting an object portion is viewed from the side.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Non-display area signal transfer lines for transferring signals that are applied to a display area of a display panel are positioned at a boundary between the display area and the non-display area. A density of transistor semiconductor layers which are disposed in the display area may be relatively rapidly reduced at the boundary between the display area and the non-display area where the signal transfer lines are positioned. The rapid reduction of the density of the transistor semiconductor layers may cause a problem that a dimension of a semiconductor pattern forming a transistor semiconductor layer closest or nearest to the non-display area is unintentionally widened. This may lead to defects such as an increase or decrease in the luminance of a specific color or a specific portion within the display panel.

A display device according to exemplary embodiments of the invention will now be described in detail with reference to the accompanying drawings. Although an organic light emitting diode display as a self-emissive display device will be described as an example, the invention is not limited thereto, and may be applied to other self-emissive display devices or to display devices which are not self-emissive such as a liquid crystal display.

Figure 2:
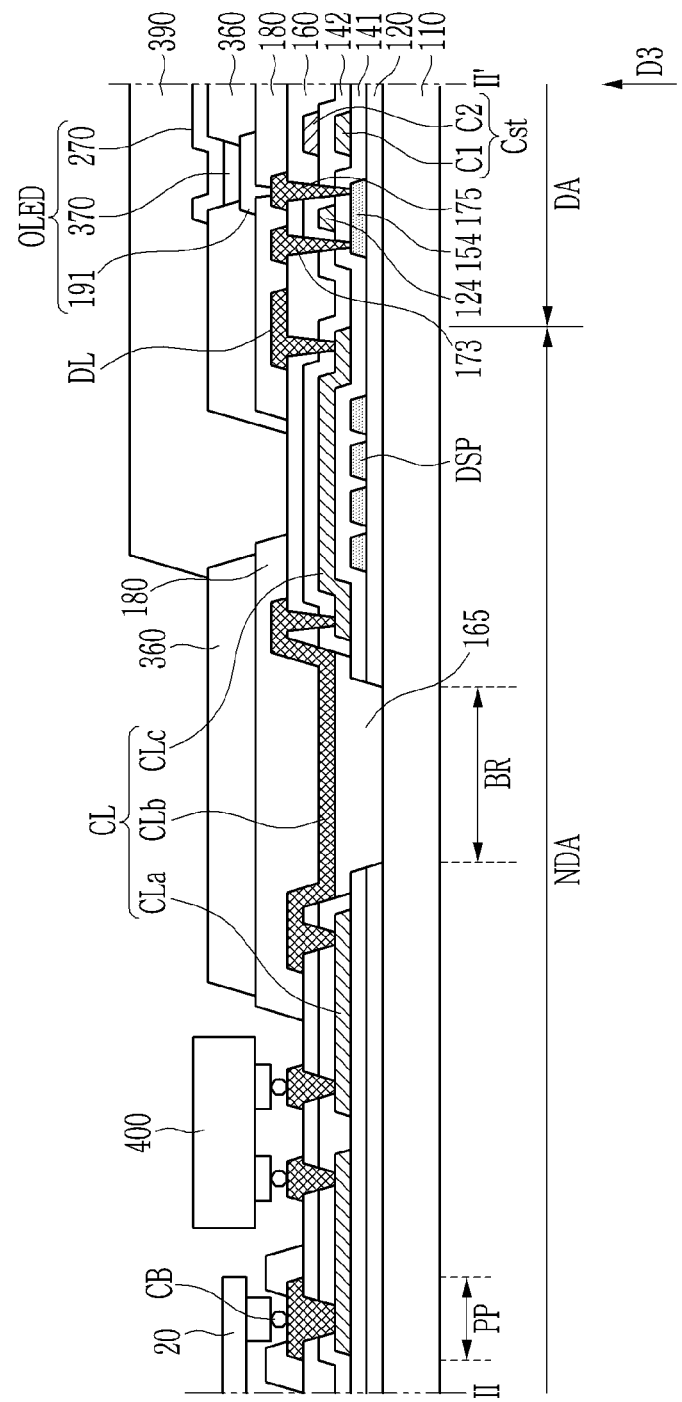
FIG. 2 is a cross-sectional view taken along line II-II' of FIG. 1.

FIG. 1 is a top plan view schematically illustrating an exemplary embodiment of a display device according to the invention, and FIG. 2 is a cross-sectional view taken along line II-II' of FIG. 1. FIG. 1 illustrates the display device in a flat state, such as before or after deformation of the display device to be bent or curved.

Referring to FIG. 1 and FIG. 2, the display device according to the exemplary embodiment includes a display panel 10, and a flexible printed circuit film 20 which is connected with the display panel 10.

The display panel 10 in which elements for displaying images are disposed or formed on a substrate 110 includes a display area DA at which an image is displayed, such as with light, and a non-display area NDA positioned around the display area DA and at which the image is not displayed. The non-display area NDA may include elements and/or (conductive) wires for generating and/or transferring various (electrical) signals to the display area DA from outside thereof or from outside the display device.

A pixel PX may be provided in plurality disposed in, e.g., a matrix form in the display area DA of the display panel 10. An image may be generated and/or displayed at the pixel PX, using light. Light may be generated within the pixel PX and/or the display area DA (e.g., self-emissive), without being limited thereto. Electrically conductive signal lines such as a data line DL and a scan line (referred to as gate lines) SL are also disposed in the display area DA. The data lines DL may lengthwise extend mainly in a first direction D1 (e.g., a column direction), and the scan lines SL may lengthwise extend mainly in a second direction D2 (e.g., a row direction) that crosses the first direction D1. Each pixel PX may be connected to a scan line SL and a data line DL among the signal lines to receive a scan signal (referred to as a gate signal) and a data signal (referred to as a data voltage) therefrom, respectively.

In a case of an organic light emitting diode display, a driving voltage line provided in plurality for transferring a driving voltage (ELVDD) to the pixels PX and an emission control line provided in plurality for transferring an emission control signal to the pixels PX may be disposed in the display area DA. The driving voltage lines may lengthwise extend in the first direction D1, and the emission control lines may lengthwise extend in the second direction D2.

Where a length dimension of an element (e.g., signal line, driving voltage line, emission control line, etc.) is larger than a width dimension thereof, the width is taken in a direction perpendicular to the length (or extension) direction of the element. The display device and components thereof are disposed in a plane defined by the first and second direction D1 and D2. A thickness of the display device and components thereof is defined in a third direction D3 crossing each of the first and second directions.

The display panel 10 may include a touch electrode provided in plurality (referred to as touch sensor layers) for sensing a contact or non-contact touch of a user relative to the display panel 10, and the touch electrodes may be mainly positioned in the display area DA. Although the display area DA is illustrated to have a quadrangular planar shape with rounded corners, the display area DA may have various planar shapes such as a polygon such as a rectangle, a circle and an ellipse.

A pad portion PP including one or more (terminal or signal) pads for receiving signals from outside of the display panel 10 is disposed in the non-display area NDA of the display panel 10. A first end of the flexible printed circuit film 20 is bonded to the pad portion PP through, e.g., an anisotropic conductive layer such as including a conductive ball CB. A second end of the flexible printed circuit film 20 opposite to the first end thereof may be connected with, e.g., an external printed circuit board ("PCB") (not shown) to receive signals such as image data, and to receive a power voltage such as a driving voltage (ELVDD) or a common voltage.

A driver that generates and/or processes various signals for driving the display panel 10 may be positioned in the non-display area NDA. The driver may include a data driver for applying a data signal to the data line, a scan driver for applying a scan signal to scan line, and/or a signal controller for controlling the scan driver.

The data driver and the signal controller are mounted in a form of an integrated circuit chip 400 in the non-display area NDA, particularly between the display area DA and the pad portion PP. The gate driver (not illustrated) may be integrated in the non-display area NDA at a left and/or right edge of the display panel 10.

Unlike in the illustrated exemplary embodiment, the data driver may be mounted in a form of an integrated circuit chip within the flexible printed circuit film 20 or may be connected to the pad portion PP in a form of a tape carrier package ("TCP"). The signal controller may be formed as an integrated circuit chip that is separate from the data driver.

In the non-display area NDA, a data connection line CL provided in plurality for transferring the data signals generated in the integrated circuit chip 400 at the non-display area NDA to the data lines DL of the display area DA are disposed between the integrated circuit chip 400 and the display area DA. In an exemplary embodiment, for example, a number of conductive lines within the data connection lines CL may be several thousand depending on resolution of the display device. Since such a relatively large number of the data connection lines CL are disposed or formed in a proposed region, the data connection lines CL may be respectively disposed or formed to have relatively very narrow widths and be spaced apart from each other disposed at intervals in a micrometer (μm) range.

Typically, a width of the display area DA is wider than that of the integrated circuit chip 400, such as shown along the second direction D2 in FIG. 2. With the widths illustrated in FIG. 2, for example, the data connection lines CL which are connected with a central portion of the integrated circuit chip 400 may extend substantially in a first direction D1. However, the data connection lines CL connected with a left or right edge portion of the integrated circuit chip 400 may extend obliquely with respect to the first direction D1. Accordingly, the data connection lines CL positioned around the left or right edge at a side of the display panel 10 are disposed at a relatively narrow interval as compared to positions other than left or right edges of the display panel 10.

The display panel 10 may include a bending region BR between the display area DA and the pad portion PP. The bending region BR is a region at which the display device and components thereof are bent such as to define a predetermined curvature radius in the display panel 10. The bending region BR may be positioned lengthwise across the display panel 10 in a second direction D2. The display panel 10 may be bent with respect to a bending axis that is parallel with the second direction D2 such that the flexible printed circuit film 20 may be positioned behind the display area DA along a thickness direction of the bend display device, for example.

In view of the bending region BR, the data connection line CL may include a first portion CLa substantially positioned between the integrated circuit chip 400 and the bending region BR, a second portion CLb substantially positioned in the bending region BR, and a third portion CLc substantially positioned between the bending region BR and the display area DA. Hereinafter, the third portion CLc of the data connection line CL is also referred to as "data connector."

The integrated circuit chip 400 may be disposed between the bending region BR and the pad portion PP.

The second portion CLb of the data connection line CL may be positioned across the bending region BR to lengthwise extend in a direction substantially parallel with the first direction D1, for example. The first portion CLa and the third portion CLc of the data connection line CL may include or be made of a same material as each other, and the second portion CLb may include or be made of a material that is different from that of the first portion CLa and the third portion CLc. This is because, since the second portion CLb is bent along with other components of the display device during the bending of the bending region BR, it is advantageous for the second portion CLb to include or be made of a more flexible material than that of portions of the data connection line CL outside of the bending region BR. In other words, as flexibility of the second portion CLb increases, a stress or a strain on the data connection line CL becomes smaller, thereby reducing a risk of deterioration or breaking thereof during bending.

Due to a photo-loading effect when semiconductor patterns of the display area DA are formed, a density of the semiconductor patterns (e.g., a planar area occupied by the semiconductor pattern per unit area) relatively rapidly changes at a boundary between the display area DA and the non-display area NDA adjacent thereto to cause uneven dimensions of the semiconductor patterns. One or more exemplary embodiments provide dummy semiconductor pattern DSP below the third portion CLc of the data connection line CL which is closest to the display area DA to overlap the third portion CLc. The plural dummy semiconductor patters DSP disposed at a portion of the non-display area NDA closest to the display area DA reduces or effectively prevents dimensions of semiconductor patterns from being uneven, especially at the boundary.

In further detail, when a semiconductor pattern constituting the transistors of the display area DA is formed in a method of manufacturing a display device, a semiconductor material layer is formed by depositing a semiconductor material on the substrate 110 (e.g., throughout the display area DA and the non-display area NDA) to be subsequently patterned through a photolithography process. The photolithography process includes an operation of coating a photosensitive material such as a photoresist on a portion of the semiconductor material layer, exposing the same by using a mask, and partially dissolving the exposed photosensitive material with a developer to form a photosensitive film pattern conforming to a pattern of the mask.

In a conventional method of manufacturing a display device, when a density difference of the semiconductor pattern to be formed in the display area DA and the non-display area NDA adjacent thereto is relatively large, the developer applied in the display area DA may undesirably flow toward the non-display area NDA. The flow of the developer may change a development speed of the photosensitive material in the display area DA, particularly in a display area region adjacent to the non-display area NDA to which the developer flows from the display area DA. Such change in development speed of the photosensitive material may undesirably lead to an increase in the dimensions of the semiconductor pattern formed in the display area DA adjacent to or closest to the non-display area NDA. The increase in dimensions may thereby result in a relatively large change in a density difference of the formed semiconductor patterns between the display area DA and the non-display area NDA. This may cause an undesirable luminance increase at an edge of the display area DA, resulting in luminance unevenness in a displayed image of the display device.

According to one or more exemplary embodiment of the invention, dummy semiconductor patterns DSP may be formed in the non-display area NDA at positions therein adjacent to or closer to the display area DA, to alleviate a relatively rapid change in a density difference of the semiconductor pattern between the display area DA and the non-display area NDA. With the dummy semiconductor patterns DSP alleviating the relatively rapid change in the density difference of the semiconductor pattern, dimensional non-uniformity of the semiconductor pattern between the between the display area DA and the non-display area NDA may be improved by reducing the flow of the developer when the semiconductor pattern is formed.

However, when the dummy semiconductor patterns DSP are formed, parasitic capacitance between the data connection lines CL may be increased to increase crosstalk. According to one or more embodiment of the invention, the dummy semiconductor patterns DSP are each formed as an island or discrete shape such as to be discrete segments separated from each other. Although not illustrated, the dummy semiconductor patterns DSP may also be positioned below the first portion CLa and/or the second portion CLb of the data connection line CL to overlap the first portion CLa and/or the second portion CLb, respectively.

A stacked structure along a thickness direction of the display panel 10 will now be described. The display panel 10 includes the substrate 110 and various layers, wires, and elements disposed or formed thereon. Although a relatively large number of pixels PX are arranged in the display area DA of the display panel 10, only one pixel PX is shown in FIG. 2 for convenience of description in order to avoid complication of the drawing. Each pixel PX may include a plurality of transistors, but one transistor will be mainly described for convenience of description.

The substrate 110 may be a flexible substrate. The substrate 110 may include or be made of a polymer such as a polyimide, a polyamide, a polycarbonate, or polyethylene terephthalate, but the invention is not limited thereto.

A buffer layer 120 is disposed on the substrate 110. The buffer layer 120 may block impurities that may diffuse from the substrate 110 into other layers disposed thereon, such as a semiconductor layer 154, to reduce a stress on the substrate 110. The buffer layer 120 may increase adhesion of the semiconductor layer 154 to the substrate 110. The buffer layer 120 is an insulating layer, but is referred to as a buffer layer in consideration of its functional features. The buffer layer 120 may include an inorganic insulating material such as a silicon oxide (SiOx) or a silicon nitride (SiNx).

The buffer layer 120 may be positioned over substantially an entire surface of the substrate 110, but may not be positioned in the bending region BR. A layer under the buffer layer 120, such as the substrate 110, may be exposed from the buffer layer 120 at the bending region BR. The buffer layer 120 is disposed substantially an entire surface of the substrate 110 except for the bending region BR because a layer including or made of an inorganic insulating material may be vulnerable during bending thereof to generate cracks, and/or damage to wires positioned on such inorganic insulating layer in the bending region BR may occur.

Although not illustrated, the substrate 110 may include or be formed in multiple layers. In an exemplary embodiment, a barrier layer for reducing or effectively preventing penetration of moisture and the like from outside the display panel 10 is disposed or formed between layers within the substrate 110, and between the multi-layered substrate 110 and the buffer layer 120.

The semiconductor layer 154 of a transistor in the display area DA is disposed on the buffer layer 120. The semiconductor layer 154 includes or defines a channel region that overlaps a gate electrode 124, and a source region and a drain region that are doped such as with an impurity and respectively disposed at opposing sides of the channel region. The semiconductor layer 154 may include polysilicon, amorphous silicon or an oxide semiconductor. The dummy semiconductor patterns DSP are disposed on the buffer layer 120 to overlap the data connector which is the third portion CLc of the data connection line CL.

A first insulating layer 141 is disposed on the semiconductor layer 154. A first gate conductor including the scan line SL, the gate electrode 124 of the transistor, a first electrode C1 of a storage capacitor Cst, and the first portion CLa and the third portion CLc of the data connection line CL are each disposed on the first insulating layer 141. The various elements of the first gate conductor may be disposed in a same layer of the display panel 10 among layers on the substrate 110.

A second insulating layer 142 is disposed on the first gate conductor. The first insulating layer 141 and the second insulating layer 142 may include an inorganic insulating material such as a silicon oxide or a silicon nitride. The first insulating layer 141 and the second insulating layer 142 may not be positioned in the bending region BR. That is, the insulating layer 141 and the second insulating layer 142 may each be disposed on substantially an entire of the substrate 110 except for the bending region BR.

A second gate conductor including a second electrode C2 of the storage capacitor Cst is disposed on the second insulating layer 142. Similar to the second electrode C2, the first portion CLa and the third portion CLc of the data connection line CL may be included in the second gate conductor. The various elements of the second gate conductor may be disposed in a same layer of the display panel 10 among layers on the substrate 110.

In an exemplary embodiment, the first portion CLa and the third portion CLc of the data connection line CL may be alternately disposed or formed along the second direction D2 as a first gate conductor and a second gate conductor with the second insulating layer 142 therebetween. In another exemplary embodiment, a plurality of the first portions CLa may be alternately disposed or formed along the second direction D2 as a first gate conductor and a second gate conductor with the second insulating layer 142 therebetween. In still another exemplary embodiment, a plurality of the third portions CLc may be alternately disposed or formed along the second direction D2 as a first gate conductor and a second gate conductor with the second insulating layer 142 therebetween.

As such, when the first portion CLa and/or the third portion CLc of the data connection line CL are disposed or formed by alternately using conductive patterns positioned at different layers from each other with the second insulating layer 142 therebetween, a distance between the data connection lines CL may be reduced while increasing a width of each data connection line CL. That is, within the data connection line CL, the first portion CLa thereof may be disposed at a different layer of the display panel 10 than that of the third portion CLc thereof.

The first gate conductor and the second gate conductor may include a metal such as molybdenum (Mo), copper (Cu), aluminum (Al), silver (Ag), chromium (Cr), tantalum (Ta), or titanium (Ti) or a metal alloy thereof. The gate electrode 124 may overlap a channel region of the semiconductor layer 154.

A third insulating layer 160 is disposed on the second gate conductor. The third insulating layer 160 may include an organic insulating material such as a polyimide, an acryl-based polymer or a siloxane-based polymer. The third insulating layer 160 may include an inorganic insulating material such as a silicon oxide or a silicon nitride. The third insulating layer 160 may not be positioned in the bending region BR. That is, the third insulating layer 160 may be disposed on substantially an entire of the substrate 110 except for the bending region BR.

A data conductor including a data line DL, a driving voltage line (not illustrated), a source electrode 173 and a drain electrode 175 of a transistor, and the second portion CLb of the data connection line CL is disposed on the third insulating layer 160. The source electrode 173 and the drain electrode 175 may respectively be connected to a source region and a drain region of the semiconductor layer 154 through contact holes defined or formed in the third insulating layer 160, the second insulating layer 142 and the first insulating layer 141. The data line DL may be connected to the third portion CLc (as a portion of the first gate conductor) of the data connection line CL through a contact hole defined or formed in the third insulating layer 160 and the second insulating layer 142. In an exemplary embodiment, when the third portion CLc is a portion of the second gate conductor, the data line DL may be connected to the third portion CLc through a contact hole defined or formed in the third insulating layer 160.

The second portion CLb of the data connection line CL which is mainly positioned in the bending region BR is connected to the first portion CLa and the third portion CLc of the data connection line CL through contact holes defined or formed in the third insulating layer 160 and the second insulating layer 142. As a result, the first portion CLa and the third portion CLc which are each a portion of the first gate conductor may be electrically connected to each other by the second portion CLb. Accordingly, a data signal outputted from the integrated circuit chip 400 in the non-display area NDA may be transferred to the data line DL of the display area DA through the first portion CLa, the second portion CLb, and the third portion CLc of the data connection line CL in order. In an exemplary embodiment, when the first portion CLa and the third portion CLc of the data connection line CL are each a portion of the second gate conductor, the second portion CLb may be connected to the first portion CLa and the third portion CLc through contact holes defined or formed in the third insulating layer 160.

In exemplary embodiments, for example, the data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta) or a metal alloy thereof.

In the bending region BR, a protective layer 165 which is an insulating layer is disposed between the substrate 110 and the second portion CLb of the data connection line CL. In the bending region BR, the protective layer 165 may be positioned immediately on the substrate 110 exposed between portions of the buffer layer 120 and the first to third insulating layers 141, 142 and 160. A lower surface of the protective layer 165 may contact an upper surface of the substrate 110, at the bending region BR.

The protective layer 165 may include an organic insulating material such as a polyimide, an acryl-based polymer or a siloxane-based polymer. When the third insulating layer 160 includes an organic insulating material, the protective layer 165 may be a portion of the third insulating layer 160. That is, the third insulating layer 160 in the display area DA and/or in the non-display area except for the bending region BR, may extend to the bending region BR to define a protective layer portion therein having the structure as described above for the protective layer 165.

The gate electrode 124, the source electrode 173 and the drain electrode 175 constitute a transistor together with the semiconductor layer 154. The transistor illustrated herein may be an emission control transistor and/or a driving transistor in a pixel of the organic light emitting diode display. The illustrated transistor may be referred to as a top-gate transistor in which the gate electrode 124 is disposed above the semiconductor 154, but a structure of the transistor is not limited thereto, and may be variously modified. In an exemplary embodiment, for example, the illustrated transistor may be a bottom-gate transistor in which the gate electrode is disposed below the semiconductor layer, and may be a vertical transistor in which the gate electrode is disposed at a side surface of the semiconductor layer.

A planarization layer 180 is disposed on the third insulating layer 160 and the data conductor. The planarization layer 180 is positioned in the bending region BR and is also positioned therearound such as in the top plan view. The second portion CLb of the data connection line CL is sandwiched between the protective layer 165 and the planarization layer 180. Accordingly, in the bending region BR, the second portion CLb may be surrounded by the planarization layer 180 and the protective layer 165 including an organic insulating material, and thus damage to the second portion CLb during bending thereof may be reduced or effectively prevented.

In an exemplary embodiment, when the third insulating layer 160 extends to the bending region BR to define a protective layer portion therein having the structure as described above for the protective layer 165, the second portion CLb of the data connection line CL may be sandwiched between the protective layer portion of the third insulating layer 160 and the planarization layer 180. Accordingly, in the bending region BR, the second portion CLb may be surrounded by the planarization layer 180 and the protective layer portion of the third insulating layer 160 including an organic insulating material, and thus damage to the second portion CLb during bending thereof may be reduced or effectively prevented.

In the display area DA, a pixel electrode 191 is disposed on the planarization layer 180. The pixel electrode 191 of each pixel PX may be connected with the drain electrode 175 of a transistor through a contact hole defined or formed in the planarization layer 180. The pixel electrode 191 may include or be formed of a reflective conductive material or a semi-transmissive conductive material, or may include or be formed of a transparent conductive material.

A pixel definition layer 360 having or defining an opening that overlaps the pixel electrode 191, is disposed on the planarization layer 180. The opening of the pixel definition layer 360 may define each pixel PX and/or pixel area thereof. Light may be emitted and/or transmitted at the opening of the pixel definition layer 360, without being limited thereto. The pixel definition layer 360 may include an organic insulating material. The pixel definition layer 360 may be disposed on the planarization layer 180 in the bending region BR. The pixel definition layer 360 may be disposed on the planarization layer 180 in the display area DA, and in a portion (e.g., bending region BR) of the non-display area NDA except for a remaining portion of the non-display area NDA.

An emission member 370 is disposed on the pixel electrode 191. The emission member 370 may include therein a first organic common layer, an emission layer, and a second organic common layer which are stacked in sequence. The first organic common layer may include at least one of a hole-injection layer and a hole-transporting layer. The emission layer may include or be made of an organic material which uniquely emits light of one of primary colors such as red, green and blue. In an exemplary embodiment, the emission layer may have a structure in which a plurality of organic material layers emitting light of different colors are stacked. The second organic common layer may include at least one of an electron-transporting layer and an electron-injection layer.

A common electrode 270 for transferring a common voltage is disposed on the emission member 370. The common electrode 270 may include or be made of a transparent conductive material such as indium tin oxide ("ITO") or indium zin oxide ("IZO"). The common electrode 270 may include or be formed by stacking a metal such as calcium (Ca), barium (Ba), magnesium (Mg), aluminum (Al) or silver (Ag) as a relatively thin layer, to have light permeability. The pixel electrode 191, the emission member 370 and the common electrode 270 of each pixel PX constitute an organic light emitting diode ("OLED").

An encapsulation layer 390 is disposed on the common electrode 270. The encapsulation layer 390 may encapsulate the emission member 370 and the common electrode 270 on the substrate 110 to reduce or effectively prevent permeation of external moisture or oxygen to the emission member 370 and the common electrode 270. The encapsulation layer 390 may include therein at least one layer including an inorganic material, and may further include at least one layer including an organic material. The encapsulation layer 390 may not be disposed in the bending region BR. The encapsulation layer 390 may not be disposed in the non-display area NDA, and may only be disposed in the display area DA without being limited thereto.

A polarization layer (not illustrated) for reducing or effectively preventing external light reflection may be disposed on the encapsulation layer 390. The polarization layer may not overlap the bending region BR. The polarization layer may not be disposed in the non-display area NDA, and may only be disposed in the display area DA without being limited thereto.

In the bending region BR, a bending protective layer (not illustrated) for releasing and protecting against stresses such as a tensile stress may be disposed on the pixel definition layer 360. The bending protective layer may be referred to as a stress neutralization layer.

A protection film (not illustrated) may be attached below the substrate 110 by an adhesive such as a pressure sensitive adhesive ("PSA") or an optically clear adhesive ("OCA"). The protection film may not be disposed in the bending region BR so as to reduce a bending stress of layers on the substrate 110 at the bending region BR.

Hereinafter, an exemplary embodiment of dummy semiconductor patterns that overlap the third portion CLc of the data connection line CL will be described in detail with reference to FIG. 3 to FIG. 5.

Figure 3:
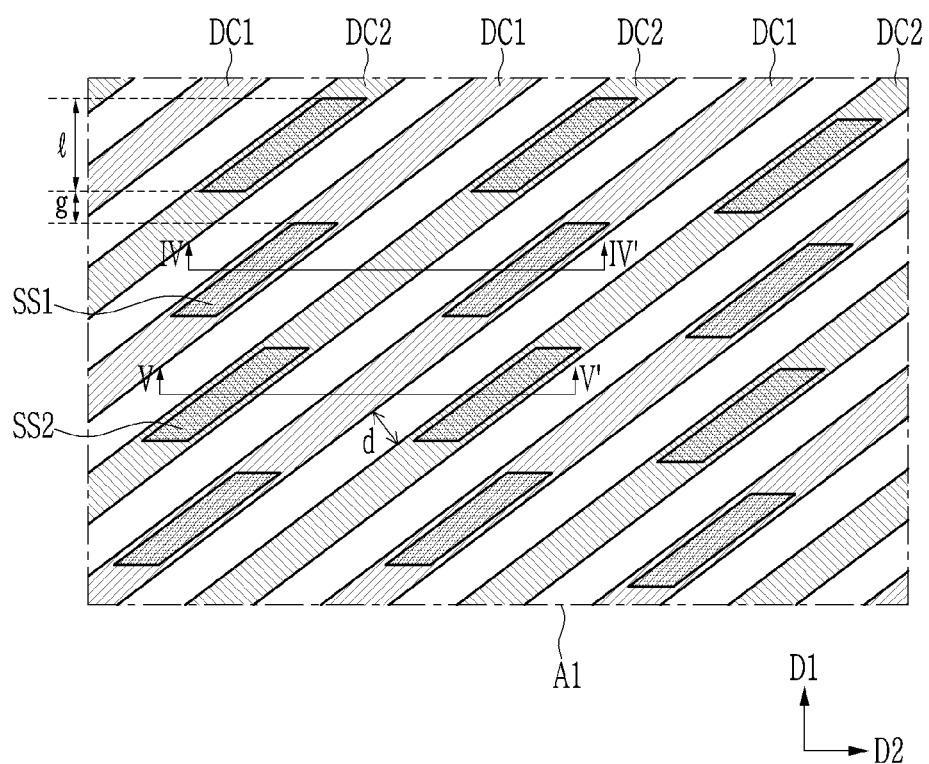
FIG. 3 is an enlarged top plan view illustrating an exemplary embodiment of region A1 in FIG. 1 according to the invention.
Figure 4:
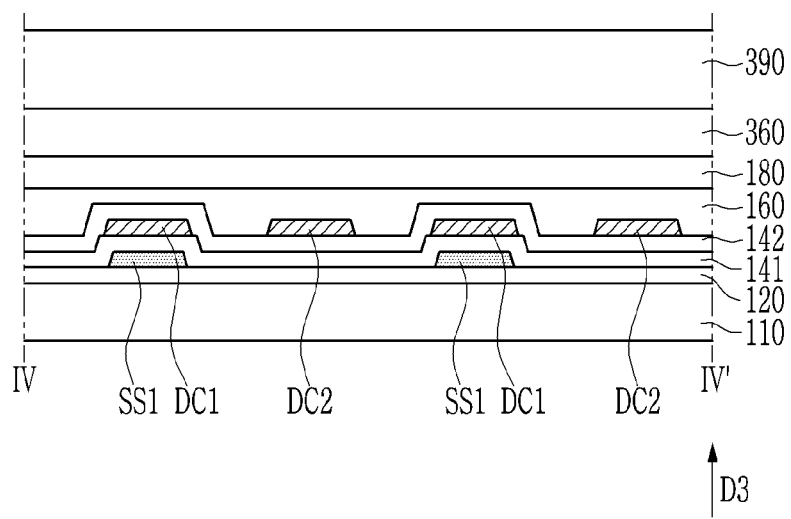
FIG. 4 is a cross-sectional view taken along line IV-IV' of FIG. 3.
Figure 5:
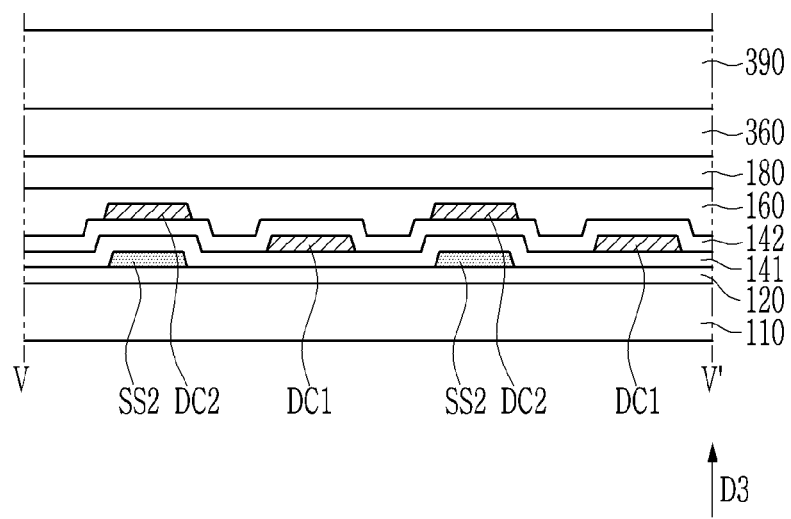
FIG. 5 is a cross-sectional view taken along line V-V' of FIG. 3.

FIG. 3 is an enlarged top plan view illustrating an exemplary embodiment of region A1 in FIG. 1 according to the invention, FIG. 4 is a cross-sectional view taken along line IV-IV' of FIG. 3, and FIG. 5 is a cross-sectional view taken along line V-V' of FIG. 3.

Referring to FIG. 1 and FIG. 3 to FIG. 5, in the non-display area NDA, data connectors DC1 and DC2 which are each third portions CLc of the data connection lines CL positioned at a right edge of the display panel 10 along the second direction D2 and between the bending region BR and the display area DA along the first direction D1, are illustrated. In addition, semiconductor segments SS1 and SS2 of the dummy semiconductor patterns DSP respectively overlapping the data connectors DC1 and DC2 are illustrated. For each data connector, a first portion thereof is overlapped by the semiconductor segments thereon and a second portion thereof is disposed between semiconductor segments separated from each other along the length of the data connector.

Although not explicitly illustrated, the semiconductor segments and data connectors positioned at a left edge of the display panel 10 opposite to the right edge of the display panel 10 where region A1 is illustrated in FIG. 1, are positioned symmetrically to those illustrated in FIG. 3 with respect to a central line of the display panel 10. The central line may be at a central position of the display panel 10 along the second direction while lengthwise extended along the first direction D1.

The data connectors DC1 and DC2 (as third portions CLc of the data connection lines CL) positioned at a respective edge of the display panel 10 lengthwise extend in an inclined direction with respect to the first direction D1. In an exemplary embodiment, for example, the data connector DC1 and DC2 may extend in a direction that is inclined by an incline angle of about 15 degrees, about 30 degrees, about 45 degrees or about 60 degrees with respect to the first direction D1. An inclination degree (e.g., incline angle) of the data connectors DC1 and DC2 may gradually increase as a distance of the data connector from a respective edge of the display panel 10 decreases. As a position of the data connector becomes closer to the respective edge of the display panel 10, the incline angle of the data connector becomes closer to the second direction D2 than the first direction D1. In an exemplary embodiment, as a position of the data connectors becomes closer to the respective edge of the display panel 10, the data connectors may have portions that lengthwise extend substantially in parallel with the second direction D2.

As such, when the data connectors DC1 and DC2 obliquely extend to be disposed inclined at the incline angle, a distance 'd' between adjacent data connectors DC1 and DC2 may be reduced. That is, as a position of the data connectors becomes closer to the respective edge of the display panel 10, the distance 'd' between adjacent data connectors decreases. The distance 'd' may be taken substantially perpendicular to a length direction of the adjacent data connectors DC1 and DC2. The distance 'd' may be about 1 micrometer or less.

Although the distance between the data connectors DC1 and DC2 is relatively very narrow, the first data connectors DC1 and the second data connectors DC2 among such narrowly spaced data connectors DC1 and DC2 may be alternately disposed with each other such as in different layers from each other, to reduce or effectively prevent occurrence of an electrical short circuit between the adjacent data connectors DC1 and DC2. As shown in FIG. 4 and FIG. 5, alternating third portions CLc of the data connection lines CL include the first data connectors DC1 as a first gate conductor disposed between the first insulating layer 141 and the second insulating layer 142 alternating with the second data connectors DC2 as a second gate conductor disposed between the second insulating layer 142 and the third insulating layer 160. Although a first data connector DC1 and a second data connector DC2 adjacent to each other are positioned relatively close to each other in a planar direction (e.g., along the first and/or second directions D1 and D2), the second insulating layer 142 may be disposed therebetween to insulate the first and second data connectors DC1 and DC2 from each other. As being in different layers from each other, the first and second data connectors DC1 and DC2 may be formed from different material layers as each other in a method of manufacturing a display device, even though such material layers may include a same material as each other.

In an exemplary embodiment of manufacturing a display device, the dummy semiconductor patterns are formed from a same one semiconductor material layer positioned between the buffer layer 120 and the first insulating layer 141. That is, the dummy semiconductor patterns may be disposed in a same layer of the display panel 10 among layers on the substrate 110.

Along a length direction of a single data connector (one DC1 or one DC2), the semiconductor segments (plural of the SS1 or plural of the SS2) respectively disposed thereon are spaced apart from each other. The length direction may be taken along the first (horizontal) direction in FIG. 2 or the direction inclined with respect to the first direction D1 in FIG. 3. That is, referring to FIG. 3, first semiconductor segments SS1 arranged along the inclined length of a single data connector DC1 may correspond to the multiple protruding dummy semiconductor patterns DSP in FIG. 2 arranged along a first-direction D1 length of the single third portion CLc of a data connection line CL.

In a conventional display device, when the dummy semiconductor patterns are formed along an entirety of a respective one of the data connectors DC1 and DC2, adjacent portions of the dummy semiconductor patterns may be in contact with each other. Accordingly, parasitic capacitance may be generated between the data connectors DC1 and DC2 to increase a load and to generate crosstalk.

However, in one or more exemplary embodiment according to the invention, the dummy semiconductor patterns are disposed or formed of the discrete semiconductor segments SS1 and SS2 spaced apart from each other. As such, adjacent portions (e.g., segments) of the dummy semiconductor patterns overlapping the adjacent data connectors DC1 and DC2 may not be in contact with each other.

The semiconductor segments SS1 and SS2 include first semiconductor segments SS1 that overlap the first data connectors DC1 and second semiconductor segments SS2 that overlap the second data connectors DC2. The first semiconductor segments SS1 are spaced apart from a respective adjacent first semiconductor segment SS1 at a predetermined interval, while overlapping the first data connectors DC1 along a direction in which the first data connectors DC1 extend, e.g., length direction or extension direction. Similarly, the second semiconductor segments SS2 are spaced apart from a respective adjacent second semiconductor segments SS2 at a predetermined interval, while overlapping the second data connectors DC2 along a direction in which the second data connectors DC2 extend.

No second semiconductor segment SS2 is positioned between first semiconductor segments SS1 adjacent to each other in the second direction D2, and no first semiconductor segment SS1 is positioned between second semiconductor segments SS2 adjacent to each other in the second direction D2. The first semiconductor segment SS1 are staggered with the second semiconductor segments SS2 along the second direction D2, so as not to be aligned in the second direction D2. That is, a semiconductor segment (SS1 or SS2) of one data connector is directly adjacent to a non-semiconductor segment portion of an adjacent data connector.

As illustrated in FIG. 4 and FIG. 5, which are cross-sectional views along line IV-IV' and line V-V' of FIG. 3, respectively, the semiconductor segments SS1 or SS2 respectively adjacent to each other are disposed at a much wider interval in the second direction D2 than that of the data connectors DC1 and DC2 along the second direction D2. Intervals between elements may be taken between edges thereof, without being limited thereto. Along the second direction D2, an edge of a respective semiconductor segment may be within opposing edges of a respective data connector.

As such, when the overall dummy semiconductor pattern is formed in a method of manufacturing a display device, for example, even if a process error occurs, the semiconductor segments SS1 and SS2 which respectively overlap the data connectors DC1 and DC2 remain spaced apart from each other and do not contact each other. Accordingly, it is possible to suppress generation of parasitic capacitance caused by the dummy semiconductor pattern while reducing a density difference with a semiconductor pattern of the display area DA by forming the dummy semiconductor pattern DSP relative to the data connection line CL in the non-display area NDA. In addition, even when specific semiconductor segments SS1 and SS2 and the data connectors DC1 and DC2 respectively positioned thereon are short-circuited, corresponding semiconductor segments on a respective data connector are physically and electrically separated from other semiconductor segments, so that no defect is caused thereby.

A gap 'g' between the semiconductor segments SS1 and SS2 adjacent to each other in the first direction D1 and a length 'l' of the semiconductor segments SS1 and SS2 in the first direction D1 may be set in consideration of a density of the dummy semiconductor pattern (e.g., a planar area occupied by the semiconductor pattern per unit area) and contact possibility between the semiconductor segments SS1 and SS2. In an exemplary embodiment, for example, the gap 'g' may be in a range of about 1 μm to about 10 μm, and the length 'l' may be in a range of about 5 μm to about 20 μm. The density of the dummy semiconductor pattern in the non-display area NDA may be advantageously closer to the density of the semiconductor layer 154 as a semiconductor pattern in the display area DA (e.g., about 35%). In an exemplary embodiment, the density of the dummy semiconductor pattern in the non-display area NDA may be up to about 25% in consideration of the present process.

A width of a respective one of the semiconductor segments SS1 and SS2 may be narrower than that of the corresponding one of data connectors DC1 and DC2 as a portion of a data connection line CL. The width of a semiconductor segment, a data connector a data connection line may be taken substantially perpendicular to a length direction thereof.

In forming the dummy semiconductor pattern in an exemplary embodiment of a method of manufacturing a display device, when a semiconductor layer (154 in FIG. 2) of a transistor of the display area DA is formed, the first and second semiconductor segments SS1 and SS2 are formed at a region where the first and second data connectors DC1 and DC2 of the non-display area NDA will overlap each the respective first and second semiconductor segments SS1 and SS2. The semiconductor layer of the transistor of the display area DA may be in a same layer as the first and/or second semiconductor segments SS1 and SS2. The first insulating layer 141 is formed on the respective first and second semiconductor segments SS1 and SS2 and on the semiconductor layer of the transistor.

When a gate electrode (124 of FIG. 2) of the transistor of the display area DA is formed, the first data connectors DC1 as third portions of different data connection lines (CLc of CL in FIGS. 1 and 2) are formed. The gate electrode of the transistor of the display area DA is in a same layer as the first data connectors DC1. When a source region and a drain region of a semiconductor layer of the transistor are doped, the first semiconductor segments SS1 overlapping the first data connectors DC1 (FIG. 4) may not be doped, but the second semiconductor segments SS2 which do not overlap the first data connectors DC1 (FIG. 5) may be doped. Thus, the second semiconductor segments SS2 may be made conductive. In an exemplary embodiment, the first semiconductor segments SS1 overlapping the first data connectors DC1 may be doped at a different level than that of the second semiconductor segments SS2 which do not overlap the first data connectors DC1.

As third portions of different data connection lines (CLc of CL in FIGS. 1 and 2), second data connectors DC2 overlapping the doped second semiconductor segments SS2 may be formed together when a second electrode (C2 in FIG. 2) of the storage capacitor (Cst in FIG. 2) of the display area DA is formed, after the second insulating layer 142 is formed on the first data connectors DC1. The second electrode of the storage capacitor of the display area DA is in a same layer as the second data connectors DC2. As a result, the first insulating layer 141 is disposed between the first semiconductor segments SS1 and the first data connectors DC1 overlapped therewith, and the first insulating layer 141 and the second insulating layer 142 are disposed between the second semiconductor segments SS2 and the second data connectors DC2 and overlapped therewith.

Figure 6:
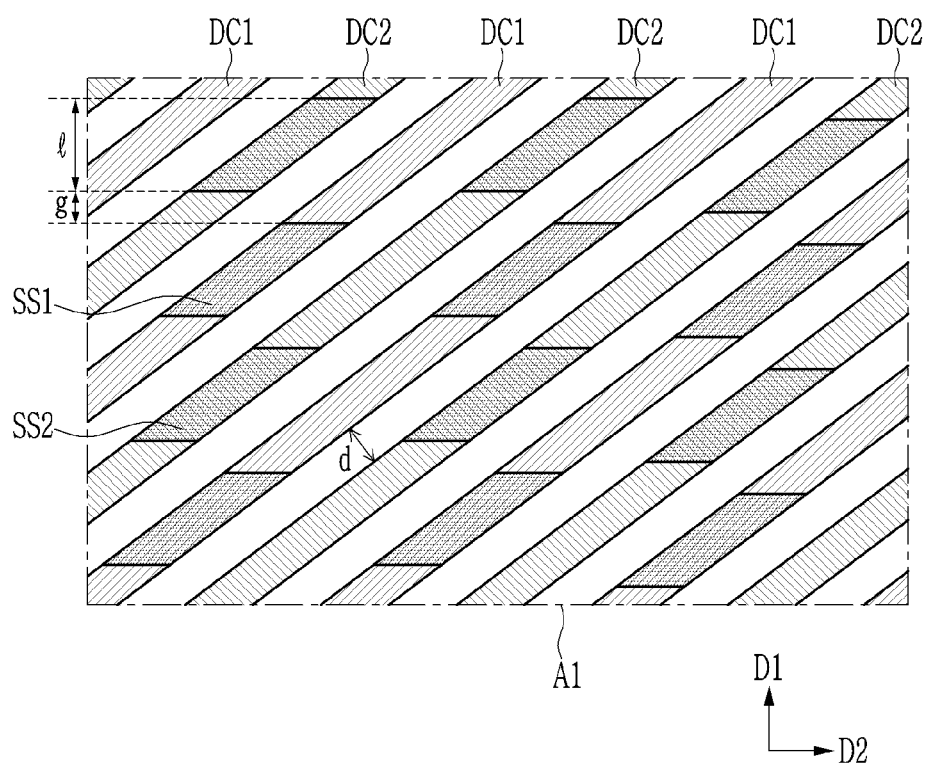
FIG. 6 and FIG. 7 are enlarged top views illustrating other exemplary embodiments of region A1 in FIG. 1 according to the invention.
Figure 7:
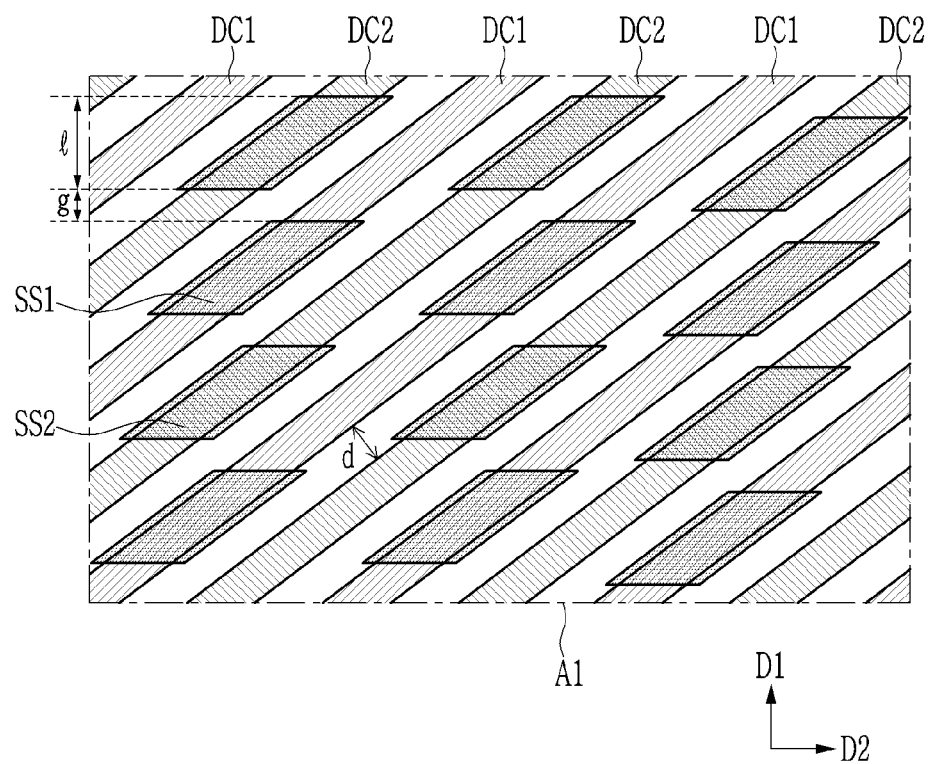

FIG. 6 and FIG. 7 are enlarged top plan views illustrating other exemplary embodiments of region A1 in FIG. 1 according to the invention.

In the aforementioned exemplary embodiment of FIG. 3 to FIG. 5, a case that a width of the semiconductor segments SS1 and SS2 is smaller than that of the data connectors DC1 and DC2 was described. However, the invention is not limited thereto.

In another exemplary embodiment, for example, the semiconductor segments SS1 and SS2 may have substantially the same width as that of the data connectors DC1 and DC2 as shown in FIG. 6. In still another exemplary embodiment, a width of the semiconductor segments SS1 and SS2 may be larger than that of the data connectors DC1 and DC2 as shown in FIG. 7.

The width of the semiconductor segments SS1 and SS2 may be designed in consideration of various conditions such as the width, length and gap of the data connectors DC1 and DC2, and/or the density of the dummy semiconductor pattern. When the overall dummy semiconductor pattern is formed in a method of manufacturing a display device, for example, even if a process error occurs, the width of the semiconductor segments SS1 and SS2 may be designed such that the segments remain spaced apart from each other and are do not contact each other. Accordingly, it is possible to suppress generation of parasitic capacitance caused by the dummy semiconductor pattern while reducing a density difference with a semiconductor pattern of the display area DA by forming the dummy semiconductor pattern DSP relative to the data connection line CL in the non-display area NDA. In addition, even when specific semiconductor segments SS1 and SS2 and the data connectors DC1 and DC2 respectively positioned thereon are short-circuited, corresponding semiconductor segments on a respective data connector are physically and electrically separated from other semiconductor segments, so that no defect is caused thereby.

Figure 8:
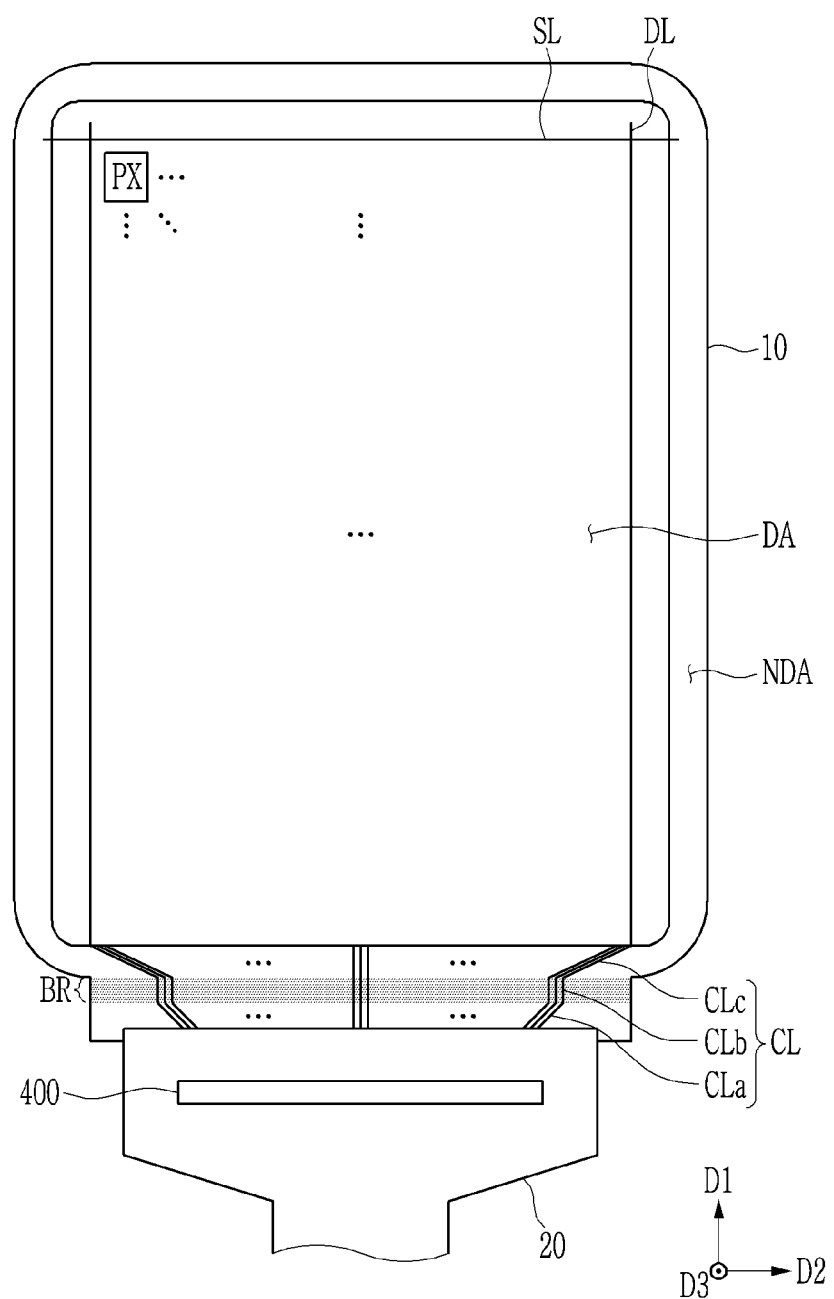
FIG. 8 is a top plan view schematically illustrating another exemplary embodiment of a display device according to the invention.

FIG. 8 is a top plan view schematically illustrating another exemplary embodiment of a display device according to the invention. FIG. 8 illustrates the display device in a flat state, such as before or after deformation of the display device to be bent or curved.

The exemplary embodiment of FIG. 8 will be described focusing on a difference from the exemplary embodiment of FIG. 1. The integrated circuit chip 400 including a data driver is mounted on the flexible printed circuit film 20. Accordingly, the first portions CLa of the data connection lines CL may be connected with a (terminal) pad portion (not illustrated) to which a first end of the flexible printed circuit film 20 is bonded. Terminal ends of the first portions CLa may be connected to the pad portion, and the pad portion may be disposed in the display panel 10 in the non-display area NDA thereof. Signals from outside the display panel 10 may pass through the pad portion to be subsequently transmitted to the pixels PX of the display area DA. A second end of the flexible printed circuit film 20 opposite to the first end thereof may be connected with another flexible substrate printed circuit film (not illustrated), or may be connected with a printed circuit board ("PCB") (not illustrated).

Unlike what is illustrated, the display panel 10 may not include the bending region BR. In this case, the data connection line CL may be continuously formed as one line at a single layer of the display panel 10 among layers on the substrate 110, instead of being divided into the first portion CLa, the second portion CLb and the third portion CLc disposed in different layers and connected to each other through contact holes defined or formed in the second insulating layer 142, or defined or formed in the second insulating layer 142 and the third insulating layer 160.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising
a display panel including a display area at which an image is displayed and a non-display area which is adjacent to the display area,
wherein the display panel includes:
a substrate;
a plurality of data lines disposed on the substrate, in the display area; and
on the substrate, in the non-display area:
a plurality of data connection lines through which data signals are transmitted to the display area from outside the display panel, the data connection lines electrically connected to the data lines in the display area;
dummy semiconductor patterns respectively disposed between the substrate and each of the data connection lines; and
a first insulating layer disposed between the dummy semiconductor patterns and the data connection lines,
wherein each of the dummy semiconductor patterns include a plurality of semiconductor pattern segments arranged between the substrate and a same data connection line among the data connection lines, the semiconductor pattern segments arranged separated from each other along the same data connection line in a top plan view.

2. The display device of claim 1, wherein
for the same data connection line, the semiconductor pattern segments corresponding thereto are separated from each other in a first direction in which lengths of the data lines extend, and
for adjacent data connection lines, the semiconductor pattern segments thereof are separated from each other in a second direction which crosses the first direction.

3. The display device of claim 2, wherein among the data connection lines,
within each data connection line, in the top plan view, a first portion thereof overlaps the semiconductor pattern segments and a second portion thereof is disposed between semiconductor segments separated from each other along the first direction, and
along the second direction, the second portions alternate with the semiconductor pattern segments.

4. The display device of claim 2, wherein lengths of the data connection lines extend in an inclined direction with respect to the first direction in which the lengths of the data lines extend.

5. The display device of claim 1, wherein
the data connection lines include a plurality of first data connection lines and a plurality of second data connection lines which alternate with each other in a second direction that crosses a first direction in which lengths of the data lines extend, and
the display panel further includes:
    a second insulating layer disposed between the first data connection lines and the second data connection lines alternating with each other along the second direction, and
    a third insulating layer which disposes the second data connection lines between the third insulating layer and second insulating layer.
6. The display device of claim 5, wherein the display panel further includes in the display area thereof:
    a transistor with which a data signal among the data signals is provided to the display area,
    a storage capacitor,
    a semiconductor layer of the transistor between the substrate and the first insulating layer,
    a first electrode of the transistor and a first electrode of the storage capacitor between the first insulating layer and the second insulating layer, and
    a second electrode of the storage capacitor between the second insulating layer and the third insulating layer.
7. The display device of claim 5, wherein
the semiconductor pattern segments include a plurality of first semiconductor segments which overlap the first data connection lines and a plurality of second semiconductor segments which overlap the second data connection lines, and
the second semiconductor segments are doped at a different level than that of the first semiconductor segments.
8. The display device of claim 7, wherein among the first and second data connection lines which alternate with each other in the second direction,
    within each first data connection line, in the top plan view, a first portion thereof overlaps the first semiconductor segments and a second portion thereof is disposed between the first semiconductor segments, and
    along the second direction, the second portions of the first data collection lines are respectively directly adjacent to a second semiconductor segment.
9. The display device of claim 8, wherein among the first and second data connection lines which alternate with each other in the second direction,
    within each second data connection line, in the top plan view, a first portion thereof overlaps the second semiconductor segments and a second portion thereof is disposed between the second semiconductor segments, and
    along the second direction, the second portions of the second data collection lines are respectively directly adjacent to a first semiconductor segment.
10. The display device of claim 1, wherein
the display panel further includes a bending region in the non-display area and at which the display panel is bent,
the data connection lines in the non-display area extend across the bending region to the display area, a portion of each of the data connection lines which is between the bending region and the display area defining a data connector, and for the data connectors of the data connection lines, the plurality of semiconductor pattern segments are disposed between the substrate and a same data connector, the semiconductor pattern segments being arranged separated from each other along the same data connector in the top plan view.
11. The display device of claim 10, wherein
the display panel further includes:
    a pad portion in the non-display area and through which the data signals are provided to the display panel from outside thereof, and
    an integrated circuit chip disposed between the pad portion and the bending region and through which the data signals are provided from the pad portion to the data connection lines in the non-display area, and
the display device further includes a flexible substrate printed circuit film bonded to the pad portion and from which the data signals are provided to the pad portion of the display panel.
12. The display device of claim 11, wherein the data connectors as respective portions of the plurality of data connection lines which are between the bending region and the display area transfer the data signals from the integrated circuit chip to the data lines in the display area.
13. The display device of claim 10, wherein
the display panel further includes a pad portion in the non-display area and through which the data signals are provided to the display panel from outside thereof,
the display device further includes a flexible substrate printed circuit film bonded to the pad portion and from which the data signals are provided to the pad portion of the display panel, the flexible substrate printed circuit film including an integrated circuit chip mounted therein, and
the data connectors as respective portions of the plurality of data connection lines which are between the bending region and the display area transfer the data signals from the flexible substrate printed circuit film to the data lines in the display area.
14. The display device of claim 1, wherein
the data connection lines in the non-display area extend therefrom to the display area, a portion of each of the data connection lines which is closest to the display area defining a data connector, and
for the data connectors of the data connection lines:
    the plurality of semiconductor pattern segments are arranged between the substrate and a same data connector, a width of each of the semiconductor pattern segments being smaller than that of the same data connector.
15. The display device of claim 1, wherein
the data connection lines in the non-display area extend therefrom to the display area, a portion of each of the data connection lines which is closest to the display area defining a data connector, and
for the data connectors of the data connection lines:
    the plurality of semiconductor pattern segments are arranged between the substrate and a same data connector, and
    a width of each of the semiconductor segments between the substrate and the same data connector is equal to that of the same data connector.
16. The display device of claim 1, wherein
the data connection lines in the non-display area extend therefrom to the display area, a portion of each of the data connection lines which is closest to the display area defining a data connector, and for the data connectors of the data connection lines:
the plurality of semiconductor pattern segments are arranged between the substrate and a same data connector, and
a width of each of the semiconductor segments between the substrate and the same data connector is larger than that of the same data connector.

17. A display device comprising:
a substrate;
a display panel including: a display area at which an image is displayed and in which is disposed a plurality of data lines;
a non-display area which is adjacent to the display area, the non-display area including:
a bending region at which the display panel is bent;
a plurality of data connection lines through which data signals are transmitted to the display area from outside the display panel, the data connection lines extending across the bending region in the non-display area to be electrically connected to the data lines in the display area;
a first portion of each of the data connection lines between the bending region and the display area defining a data connector;
dummy semiconductor patterns respectively disposed between the substrate and each of the data connectors, each of the dummy semiconductor patterns including a plurality of semiconductor pattern segments arranged between the substrate and a same data connector; and
a first insulating layer disposed between the dummy semiconductor patterns and the data connectors,
wherein the semiconductor pattern segments between the substrate and the data connectors are arranged separated from each other in a top plan view.

18. The display device of claim 17, wherein
for the same data connector, the semiconductor pattern segments thereon are separated from each other in a first direction along a length of the same data connector, and
the data connectors are arranged in a second direction which crosses the first direction, the semiconductor pattern segments between the substrate and the data connectors being arranged separated from each other in the top plan view along the second direction.

19. The display device of claim 18, wherein among the data connectors,
within each data connector, in the top plan view, a first portion thereof overlaps the semiconductor pattern segments and a second portion thereof is disposed between the semiconductor pattern segments separated from each other along the first direction, and
along the second direction, the second portions alternate with the semiconductor pattern segments.

* * * * *